Dec. 29, 1959 B. ROSS 2,919,388

SEMICONDUCTOR DEVICES

Filed March 17, 1959

INVENTOR.
BERND ROSS
BY

ATTORNEY 2,919,388

SEMICONDUCTOR DEVICES

Bernd Ross, Lexington, Ky., assignor to Hoffman Electronics Corporation, a corporation of California Application March 17, 1959, Serial No. 799,978

7 Claims. (Cl. 317—235)

The present invention relates to semiconductor devices, and more particularly to semiconductor devices having reduced surface recombination velocities and improved alphas.

Surface recombination of minority carriers in a semiconductor device reduces its effectiveness of operation, and, in the case of a transistor, high surface recombination velocities reduce the alpha, or current amplification of the transistor. In ordinary p-n junction devices which depend upon minority carrier flow, high surface recombination velocities eliminate minority carriers in the region within a diffusion length of the surface, resulting in a diffusion gradient towards the surface and diverting a portion of the minority carrier flow from its desired path. This diversion is undesirable.

It is an object of the present invention, therefore, to provide a novel semiconductor device.

It is another object of the present invention to provide a novel semiconductor device having reduced surface recombination velocities.

According to the present invention, a semiconductor device comprises a body portion covered by a layer of a conductivity type opposite to that of the body portion. A non-electrode part of the layer is isolated from the electrode part by channels so as to be electrically floating and capable of acquiring an electrical charge.

The features of the present invention which are believed to be novel are set forth with particularity in the appended claims. The present invention, both as to its organization and manner of operation, together with further objects and advantages thereof, may best be understood by reference to the following description, taken in connection with the accompanying drawings, in which, Figure 1 is a plan view of a semiconductor according to the present invention.

Figure 1:
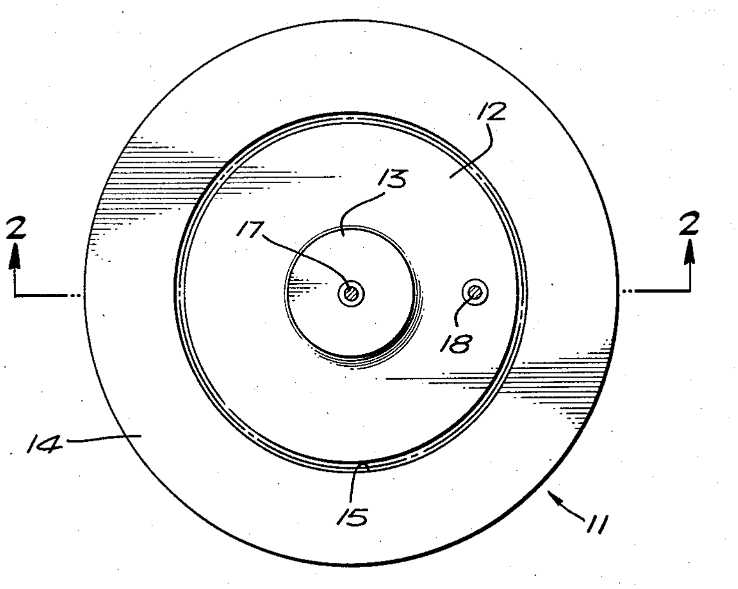
Figure 2:
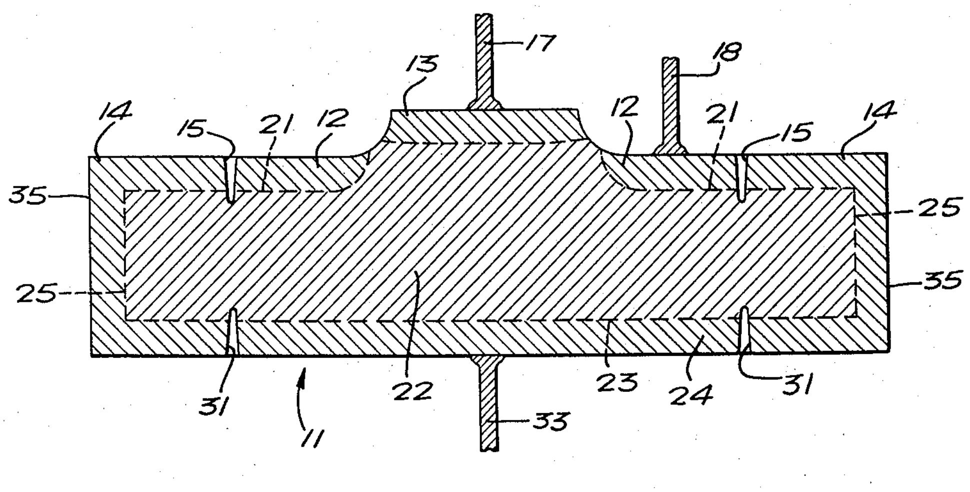

Figure 2 is a sectional view taken along line 2—2 of Figure 1.

Referring now to the drawings, Figure 1 shows semiconductor 11 having emitter region 12 and base region 13. Floating region 14 is separated from emitter region 12 by channel 15. Base lead 17 is ohmically connected to base 13 and emitter lead 18 is ohmically connected to emitter region 12.

Figure 2 shows p-n junction 21 of semiconductor 11 in the region between p-type emitter region 12 and n-type base region 22, p-n junction 23 in the region between n-type base region 22 and p-type collector region 24, and p-n junction 25 in the region between n-type base region 22 and p-type floating region 14. If desired, the conductivity types may be reversed. Channel 15 separates floating region 14 from emitter region 12, and channel 31 separates floating region 14 from collector region 24. Base lead 17 makes ohmic contact with n-type base region 22 through n-type base region 13, which was made degenerate by heavy diffusion with phosphorus until it became metallic in behavior. Degeneration is necessary because of the relatively high resistivity of bases. Emitter lead 18 is ohmically connected to emitter region 12, and collector lead 33 is ohmically connected to collector region 24.

The desired path of minority carrier flow is from emitter region 12 to collector region 24. Some minority carriers, however, diffuse towards floating region 14. In an ordinary p-n junction device not provided with channels 15 and 31 there can be no p-n junction such as p-n junction 25, and the region within a diffusion length of surface 35 would be swept clean of minority carriers because of high surface recombination velocities. This would result in a diffusion gradient towards surface 35, and a portion of the minority carrier flow would be diverted from its desired path, resulting in a reduced alpha. The situation would be aggravated by the presence of the injected electrons made available for recombination by the bias applied to base region 22. In the case of the device shown in Figure 2, however, when a minority carrier diffuses towards surface 35 and goes across p-n junction 25, it assumes an electrical charge, because channels 15 and 31 cause region 14 to be electrically floating. With each minority carrier that diffuses into it, floating region 14 acquires a higher charge and exerts more of a repelling force on the minority carriers, until a charge is developed that reflects all minority carriers back into base region 22. The subsequent minority carriers will then follow the desired direct path between emitter region 12 and collector region 24. The decreased surface recombination velocities will result in an increased alpha.

While particular embodiments of the present invention have been shown and described, it will be obvious to those skilled in the art that changes and modifications may be made without departing from this invention in its broader aspects, and, therefore, the aim in the appended claims is to cover all such changes and modifications as fall within the true spirit and scope of this invention.

I claim:

1. A semiconductor device comprising: a base region of a first conductivity type; an emitter region of a second conductivity type; a collector region of said second conductivity type; and a floating region of said second conductivity type contiguous with said base region and physically separated from said emitter and collector regions by first and second channels so as to be electrically floating and capable of acquiring an electrical charge.

2. Apparatus as defined in claim 1 including, in addition, base, emitter, and collector leads ohmically coupled to said base, emitter, and collector regions, respectively.

3. Apparatus as defined in claim 2 in which said base region is disc-like in shape and has upper and lower portions, and in which said first channel extends into said upper portion and said second channel extends into said lower portion.

4. Apparatus as defined in claim 3 in which said semiconductor comprises silicon, said first conductivity type is n-type, and said second conductivity type is p-type.

5. A semiconductor device comprising: a base region; an emitter region; a collector region; and a floating region contiguous with said base region and separated from said emitter and collector regions by channels so as to be electrically floating and capable of acquiring an electrical charge.

6. A semiconductor device comprising: a base region of a first conductivity type; a base lead ohmically coupled to said base region; a diffused layer of a second conductivity type physically divided into emitter, collector, and floating regions by first and second channels, said layer covering the entire surface of said base region with the exception of the region of said channels and the vicinity where said base lead is coupled to said base region, and said floating region being capable of acquiring an electrical charge; an emitter lead ohmically coupled to said emitter region; and a collector lead ohmically coupled to said collector region.

7. Apparatus as defined in claim 6 in which said base region is disc-like in shape and has upper and lower portions, and in which said first channel extends into said upper portion and said second channel extends into said lower portion.

References Cited in the file of this patent

UNITED STATES PATENTS

| | | |
|---|---|---|
| 2,629,800 | Pearson | Feb. 24, 1953 |
| 2,672,528 | Shockley | Mar. 16, 1954 |

FOREIGN PATENTS

| | | |
|---|---|---|
| 67,153 | France | June 3, 1957 |